(12) United States Patent
Cha et al.

(10) Patent No.: US 9,990,163 B2
(45) Date of Patent: Jun. 5, 2018

(54) METHODS OF OPERATING SEMICONDUCTOR MEMORY DEVICES WITH SELECTIVE WRITE-BACK OF DATA FOR ERROR SCRUBBING AND RELATED DEVICES

(71) Applicant: Samsung Electronics Co., Ltd., Suwon-si, Gyeonggi-do (KR)

(72) Inventors: Sang-Uhn Cha, Hwasung-si (KR); Hoi-Ju Chung, Hwasung-si (KR); Uk-Song Kang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/290,339

(22) Filed: Oct. 11, 2016

(65) Prior Publication Data

US 2017/0109232 A1    Apr. 20, 2017

(30) Foreign Application Priority Data

Oct. 20, 2015    (KR) .......................... 10-2015-0145731

(51) Int. Cl.
*G11C 11/34*    (2006.01)
*G06F 3/06*    (2006.01)
*G11C 29/52*    (2006.01)
*G06F 11/10*    (2006.01)
*G11C 11/16*    (2006.01)

(52) U.S. Cl.
CPC ............ *G06F 3/0679* (2013.01); *G06F 3/064* (2013.01); *G06F 3/0619* (2013.01); *G06F 11/106* (2013.01); *G11C 29/52* (2013.01); *G11C 11/1673* (2013.01); *G11C 11/1675* (2013.01)

(58) Field of Classification Search
CPC ...... G06F 3/0679; G06F 11/106; G06F 3/064; G06F 3/0619; G11C 29/52; G11C 11/1675; G11C 11/1673
See application file for complete search history.

(56) References Cited

U.S. PATENT DOCUMENTS

| | | |
|---|---|---|
| 6,591,393 B1 | 7/2003 | Walker et al. |
| 7,051,264 B2 | 5/2006 | Leung et al. |
| 7,447,950 B2 | 11/2008 | Takahashi et al. |
| 8,156,402 B2 | 4/2012 | Kohler et al. |
| 8,775,899 B2 | 7/2014 | Kamoshida |
| 2008/0168331 A1 | 7/2008 | Vogelsang et al. |
| 2012/0317352 A1* | 12/2012 | Kang ............... G11C 11/40611 711/106 |
| 2014/0245105 A1* | 8/2014 | Chung ............... G06F 11/1048 714/763 |

* cited by examiner

Primary Examiner — Mohammed A Bashar
(74) Attorney, Agent, or Firm — Ward and Smith, P.A.

(57) ABSTRACT

A method of scrubbing errors from a semiconductor memory device including a memory cell array and an error correction circuit, can be provided by accessing a page of the memory cell array to provide a data that includes sub units that are separately writable to the page of memory and to provide parity data configured to detect and correct a bit error in the data and selectively enabling write-back of a selected sub unit of the data responsive to determining that the selected sub unit of data includes a correctable error upon access as part of an error scrubbing operation.

18 Claims, 20 Drawing Sheets
METHODS OF OPERATING SEMICONDUCTOR MEMORY DEVICES WITH SELECTIVE WRITE-BACK OF DATA FOR ERROR SCRUBBING AND RELATED DEVICES

CROSS-REFERENCE TO RELATED APPLICATIONS

This US application claims the benefit of priority under 35 USC § 119 to Korean Patent Application No. 10-2015-0145731, filed on Oct. 20, 2015, in the Korean Intellectual Property Office, the content of which is incorporated herein in its entirety by reference.

FIELD

The present disclosure relates to the field of memory, and more particularly to error correction for memories and methods of operating the same.

BACKGROUND

Semiconductor memory devices may be classified into non-volatile memory devices, such as flash memory devices, and volatile memory devices, such as DRAMs. High speed operation and cost efficiency of DRAMs make it possible for DRAMs to be used for system memories. Due to reductions in the fabrication design rule of DRAMs, however, errors in DRAM memory cells, for example, may be more likely to occur.

SUMMARY

In some embodiments, a method of scrubbing errors from a semiconductor memory device including a memory cell array and an error correction circuit, can be provided by accessing a page of the memory cell array to provide a data that includes sub units that are separately writable to the page of memory and to provide parity data configured to detect and correct a bit error in the data and selectively enabling write-back of a selected sub unit of the data responsive to determining that the selected sub unit of data includes a correctable error upon access as part of an error scrubbing operation.

In some embodiments, a method of operating a semiconductor memory device including a memory cell array and an error correction circuit can include selecting at least one sub-page of a page of memory cells in the memory cell array in response to a first command received from an external memory controller and reading a first unit of data including at least two sub units of data and parity data from the sub-page, where the at least two sub units of data includes a first sub unit of data and a second sub unit of data, the first sub unit of data is read from a first memory location of the sub-page and the second sub unit of data is read from a second memory location of the sub-page. An error correction circuit can determine whether the first unit of data includes an error bit and when the first unit of data includes an error bit in the second sub unit, the error bit can be corrected using the parity data of the first unit of data in the error correction circuit to provide a corrected second sub unit of data and the corrected second sub unit of data can be written back to the second memory location of the sub-page.

In some embodiments, a method of operating a semiconductor memory device including a memory cell array and an error correction circuit can be provided by selecting at least one sub-page of a page of memory cells in the memory cell array in response to a first command received from an external memory controller and reading a first unit of data including at least two sub units of data and parity data from the sub-page, where the at least two sub units of data includes a first sub unit of data and a second sub unit of data, the first sub unit of data is read from a first memory location of the sub-page and the second sub unit of data is read from a second memory location of the sub-page. An error correction circuit can determine whether the first unit of data includes an error bit and when the first unit of data includes an error bit in the first sub unit of data, the error bit can be corrected using the parity data of the first unit of data in the error correction circuit to provide a corrected first sub unit of data. Write parity data can be generated based on a write data and the corrected first sub unit of data and a modified codeword can be written in a memory location of the sub-page, where the modified codeword includes at least the write data and the write parity data.

In some embodiments, a semiconductor memory device can include a memory cell array that includes a plurality of bank arrays, each having a plurality of pages of memory cells. A control logic circuit can be configured to decode a command from an external memory controller to generate control signals and an error correction circuit can be configured to perform an error correction code (ECC) decoding on read data fetched from the memory cell array, where the control logic circuit can be configured to select a sub-page of a page of the plurality of pages in response to a first command received from the memory controller and can be configured read a first unit of data including at least two sub units of data and parity data from the sub-page, where the at least two sub units of data includes a first sub unit of data and a second sub unit of data, the first sub unit of data is read from a first memory location of the sub-page and the second sub unit of data is read from a second memory location of the sub-page. The control logic circuit can determine whether the first unit of data includes an error bit and when the first unit of data includes the error bit in the second sub unit of data, the error bit is corrected to provide corrected second sub unit of data, and a write back of the corrected second sub unit of data can be performed to the second memory location of the sub-page.

BRIEF DESCRIPTION OF THE DRAWINGS

Example embodiments will be described below in more detail with reference to the accompanying drawings.

DETAILED DESCRIPTION

Figure 1:
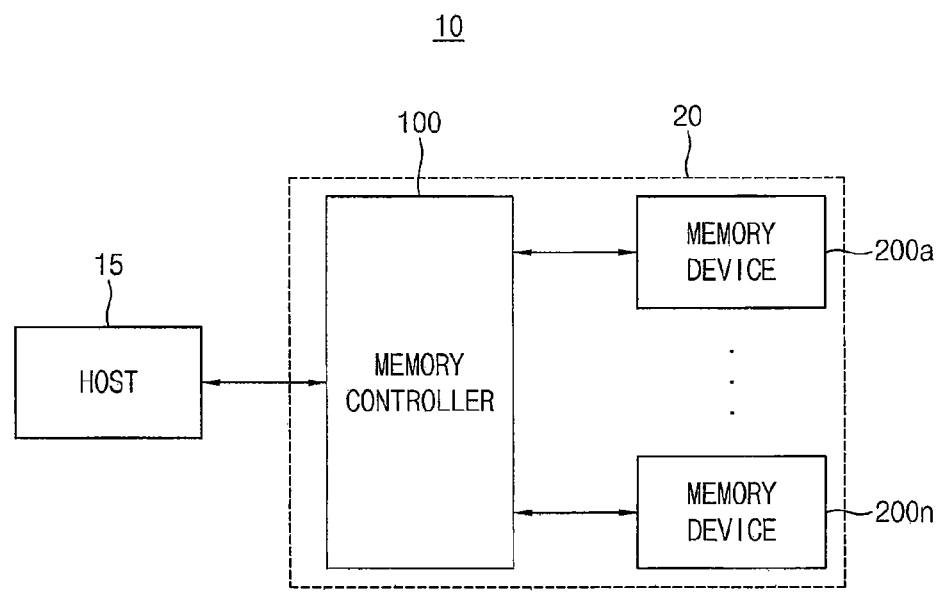
FIG. 1 is a block diagram illustrating an electronic system according to example embodiments.

Various example embodiments will be described more fully hereinafter with reference to the accompanying drawings, in which some example embodiments are shown. However, the present inventive concept may be embodied in many different forms and should not be construed as limited to the example embodiments set forth herein. These example embodiments are just for disclosing of the inventive concept and many implementations and variations are possible that do not require the details provided herein. It should also be emphasized that the present inventive concept provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present inventive concept. Like numerals refer to like elements throughout.

It will be understood that, although the terms first, second, third etc. may be used herein to describe various elements, these elements should not be limited by these terms. These terms are generally used to distinguish one element from another. Thus, a first element discussed below in one section of the specification could be termed a second element in a different section of the specification without departing from the teachings of the present inventive concept. Also, terms such as "first" and "second" may be used in the claims to name an element of the claim, even thought that particular name is not used to describe in connection with the element in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control overall operation of the memory system 20. The memory controller 100 may control overall data exchange between the host 15 and the plurality of semiconductor memory devices 200a~200n. For example, the memory controller 100 may write data in the plurality of semiconductor memory devices 200a~200n or read data from the plurality of semiconductor memory devices 200a~200n in response to request from the host 15.

In addition, the memory controller 100 may issue operation commands to the plurality of semiconductor memory devices 200a~200n for controlling the plurality of semiconductor memory devices 200a~200n.

In some embodiments, each of the plurality of semiconductor memory devices 200a~200n may be a may be a memory device including resistive type memory cells such as a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 200a~200n may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or erase data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell may change a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes the need for an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2:
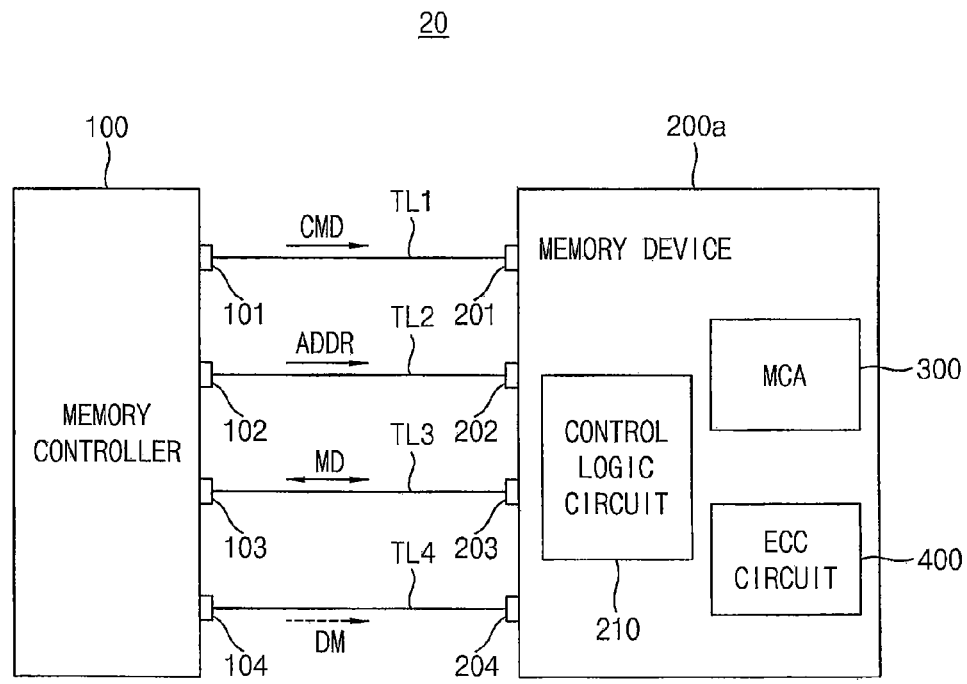
FIG. 2 is a block diagram illustrating the memory system shown in FIG. 1.

FIG. 2 is a block diagram illustrating the memory system shown in FIG. 1.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 20 may include the memory controller 100 and the semiconductor memory device 200a. Each of the memory controller 100 and the semiconductor memory device 200a may be separate semiconductor chips or a separate group of chips (e.g., the memory controller 100 and the semiconductor memory device 200a may be packaged together in stacking form of the semiconductor chips).

The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange main data MD through a data transmission line TL3. The separate pins 104 and 204 may transmit a data mask signal DM through a transmission line TL4. The semiconductor memory device 200a may perform a masked write operation in response to the data mask signal DM. In example embodiments, the separate pins 104 and 204 and the transmission line TL4 may not be included in the memory system 20.

The semiconductor memory device 200a may include a memory cell array 300 that stores the main data MD, an error correction circuit 400 and a control logic circuit 210 (also referred to as a 'control logic') that controls the error correction circuit 400.

When the command signal CMD corresponds to a scrubbing command, the semiconductor memory device 200a may activate one page in the memory cell array 300, may select at least one sub-page of the activated page and may read a first unit of data from the selected sub-page. The first unit of data may include at least two sub units of data and a parity data associated with the two sub units of data. In addition, the at least two sub units may include a first sub unit and a second sub unit, where the second sub unit of data includes an error bit (i.e., the value of a data bit in the second sub unit is the opposite value compared to the value that was originally written to the second sub unit). The semiconductor memory device 200a may perform a scrubbing operation that corrects the error bit in the second sub unit of data using the parity data and writes back the corrected second sub unit of data in a memory location corresponding to the second sub unit in the sub-page.

When the command signal CMD corresponds to a refresh command designating a refresh operation of the semiconductor memory device 200a, the semiconductor memory device 200a may perform the above-mentioned scrubbing operation while performing a refresh operation.

In example embodiments, a size of the first unit of data may correspond to a size of a codeword unit of the semiconductor memory device 200a and each size of the first sub unit of data and second sub unit of data may correspond to a size of data that is pre-fetched in a read operation and a write operation of the semiconductor memory device 200a.

Figure 3:
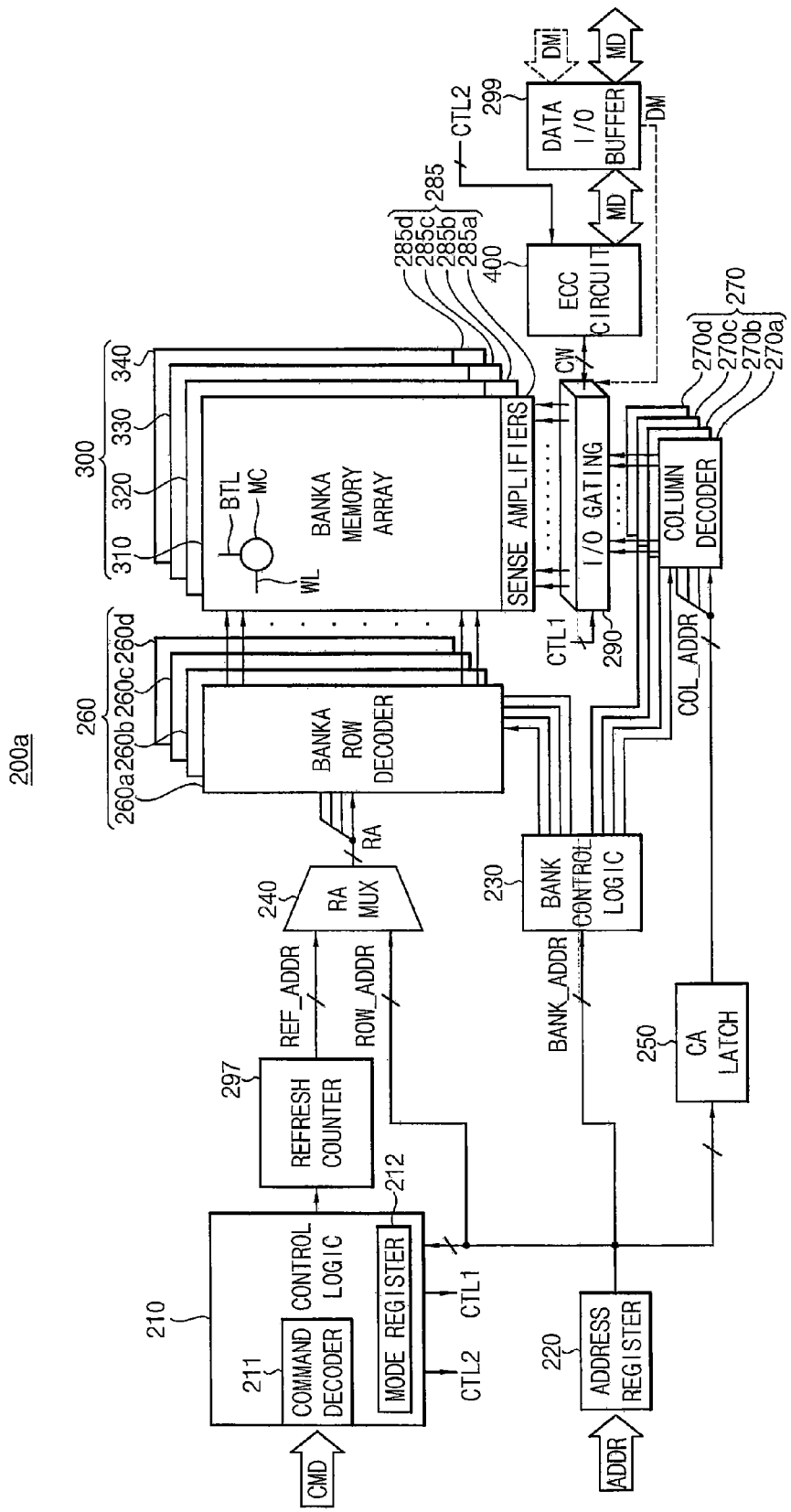
FIG. 3 is a block diagram illustrating the semiconductor memory device shown in FIG. 2, according to example embodiments.

FIG. 3 is a block diagram illustrating the semiconductor memory device shown in FIG. 2, according to example embodiments.

Referring to FIG. 3, the semiconductor memory device 200a may include the control logic circuit 210, an address register 220, a bank control logic 230, a refresh counter 297, a row address multiplexer 240, a column address latch 250, a row decoder 260, a column decoder 270, the memory cell array 300, a sense amplifier unit 285, an input/output (I/O) gating circuit 290, the error correction circuit 400, and a data input/output (I/O) buffer 299.

In some embodiments, the refresh counter 297 may not be included in the semiconductor memory device 200a. That is, when the memory cell array 300 is implemented with a plurality of resistive type memory cells (or other non-volatile memory), the refresh counter 297 may not be included in the semiconductor memory device 200a.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BTL. The first through fourth bank arrays 310~340, the first through fourth bank row decoders 260a~260d, the first through fourth bank column decoders 270a~270d and first through fourth bank sense amplifiers 285a~280d may form first through fourth banks. Although the semiconductor memory device 200a shown in FIG. 3 illustrates four banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210. The refresh counter 297 may be included when the memory cells MC are implemented with DRAM.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 in order to output data corresponding to the column address COL_ADDR.

The I/O gating circuit 290 may include circuitry for gating input/output data. The I/O gating circuit 290 may further include input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written in one bank array of the first through fourth bank arrays 310~340 may be provided to the data I/O buffer 299 from the memory controller 100. The main data MD provided to the data I/O buffer 299 may be provided to the error correction circuit 400. The main data MD is encoded to provide the codeword CW via the error correction circuit 400, and the codeword CW is provided to the I/O gating circuit 290. The write driver may write the codeword CW in one bank array of the first through fourth bank arrays 310~340.

The data I/O buffer 299 may provide the main data MD from the memory controller 100 to the error correction circuit 400 in a write operation and may provide the main data MD from the error correction circuit 400 to the memory controller 100 in a read operation. The data I/O buffer 299 may receive the data mask signal DM from the memory controller 100 and may provide the data mask signal DM to the I/O gating circuit 290.

The error correction circuit 400, in a write operation, may generate parity data based on the main data MD from the data I/O buffer 299, and may provide the I/O gating circuit 290 with the codeword CW including the main data MD and the parity data. The I/O gating circuit 290 may write the codeword CW in one bank array.

In addition, the error correction circuit 400, in a read operation, may receive the codeword CW, read from one bank array, from the I/O gating circuit 290. The error correction circuit 400 may perform ECC decoding on the main data MD based on the parity data in the codeword CW, may correct a single bit error in the main data MD and may provide corrected main data to the data I/O buffer 299.

In addition, the error correction circuit 400, in a scrubbing mode, may perform a scrubbing operation that reads a first unit of data including a first sub-unit of data, a second sub unit of data and a parity data, from a selected sub-page of a plurality of sub-pages in an activated page, corrects the second sub unit of data including an error bit by using a parity data and writes back the corrected second sub unit of data in a memory location corresponding to the second sub unit in the sub-page.

The control logic circuit 210 may control operations of the semiconductor memory device 200a. For example, the control logic circuit 210 may generate control signals for the semiconductor memory device 200a in order to perform a write operation or a read operation. The control logic circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290 a second control signal CTL2 to control the error correction circuit 400.

When the command CMD corresponds to a scrubbing command designating a scrubbing operation, the control logic circuit 210 generates the first control signal CTL1 and the second control signal CTL2 respectively to the I/O gating circuit 290 and the error correction circuit 400 such that the I/O gating circuit 290 and the error correction circuit 400 perform the above-described scrubbing operation.

FIGS. 4A to 4E are circuit diagrams of examples of the memory cell shown in FIG. 3, according to example embodiments.

Figure 4A:
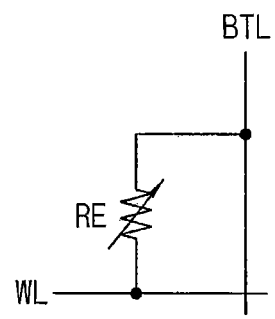
FIGS. 4A to 4E are circuit diagrams of examples of the memory cell shown in FIG. 3, according to example embodiments.
Figure 4B:
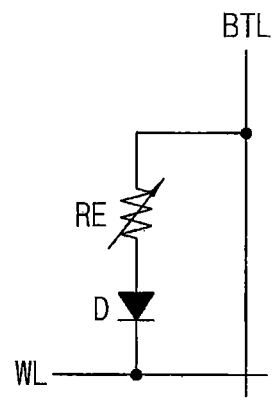
Figure 4C:
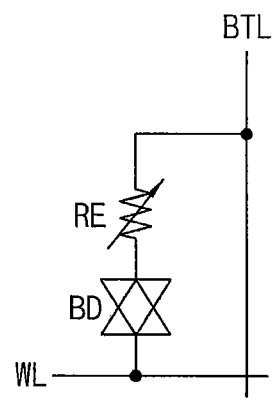
Figure 4D:
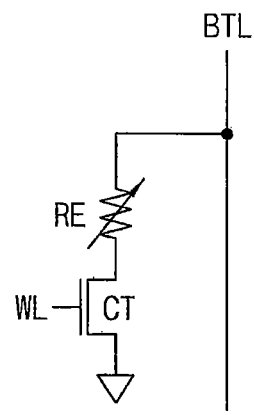
Figure 4E:
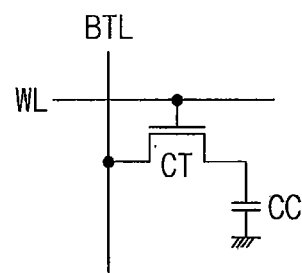

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BTL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage.

Figure 5:
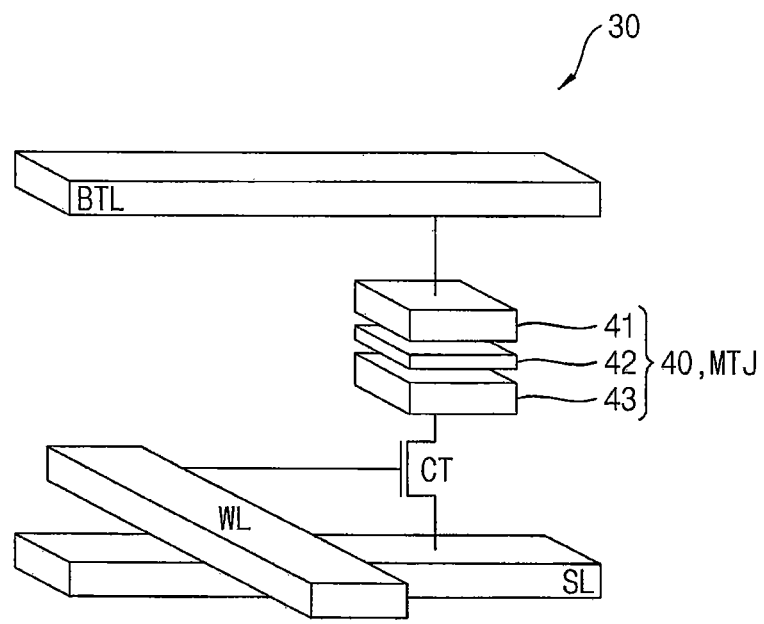
FIG. 5 illustrates an example of the memory cell (referred to as STT-MRAM cell) shown in FIG. 3, according to example embodiments.

FIG. 5 illustrates an example of the memory cell (referred to as STT-MRAM cell) shown in FIG. 3, according to example embodiments.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer may be further provided.

In order to perform a write operation of the STT-MRAM cell 30, a logic high voltage is applied to the word-line WL to turn on the cell transistor CT. A program current, for example, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
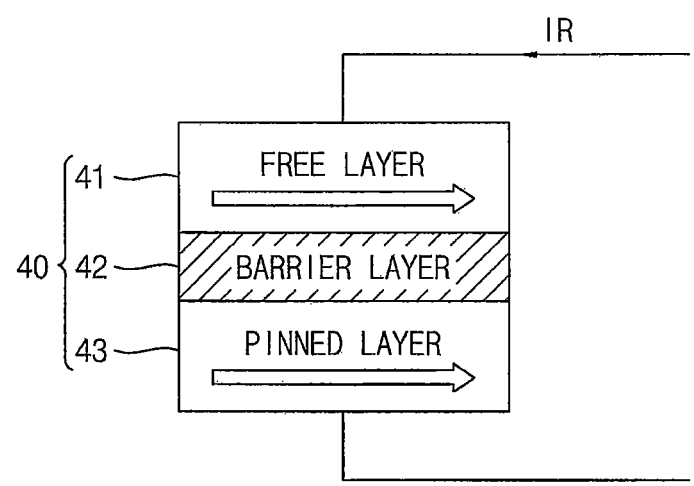
FIGS. 6A and 6B illustrate a magnetization direction according to data written to the MTJ element shown in FIG. 5.
Figure 6B:
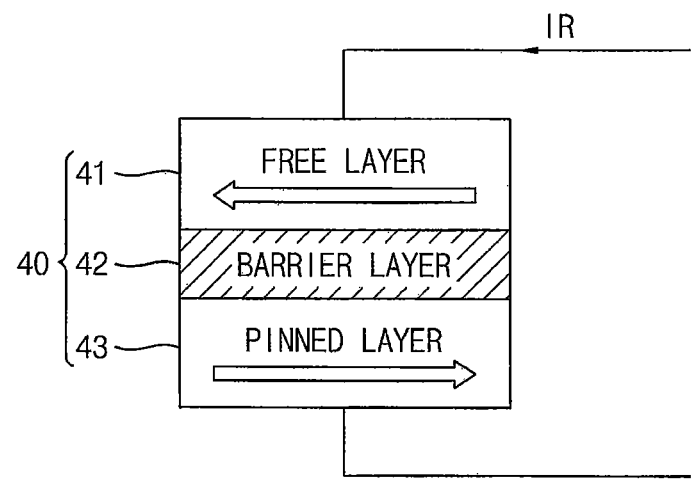

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much less than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
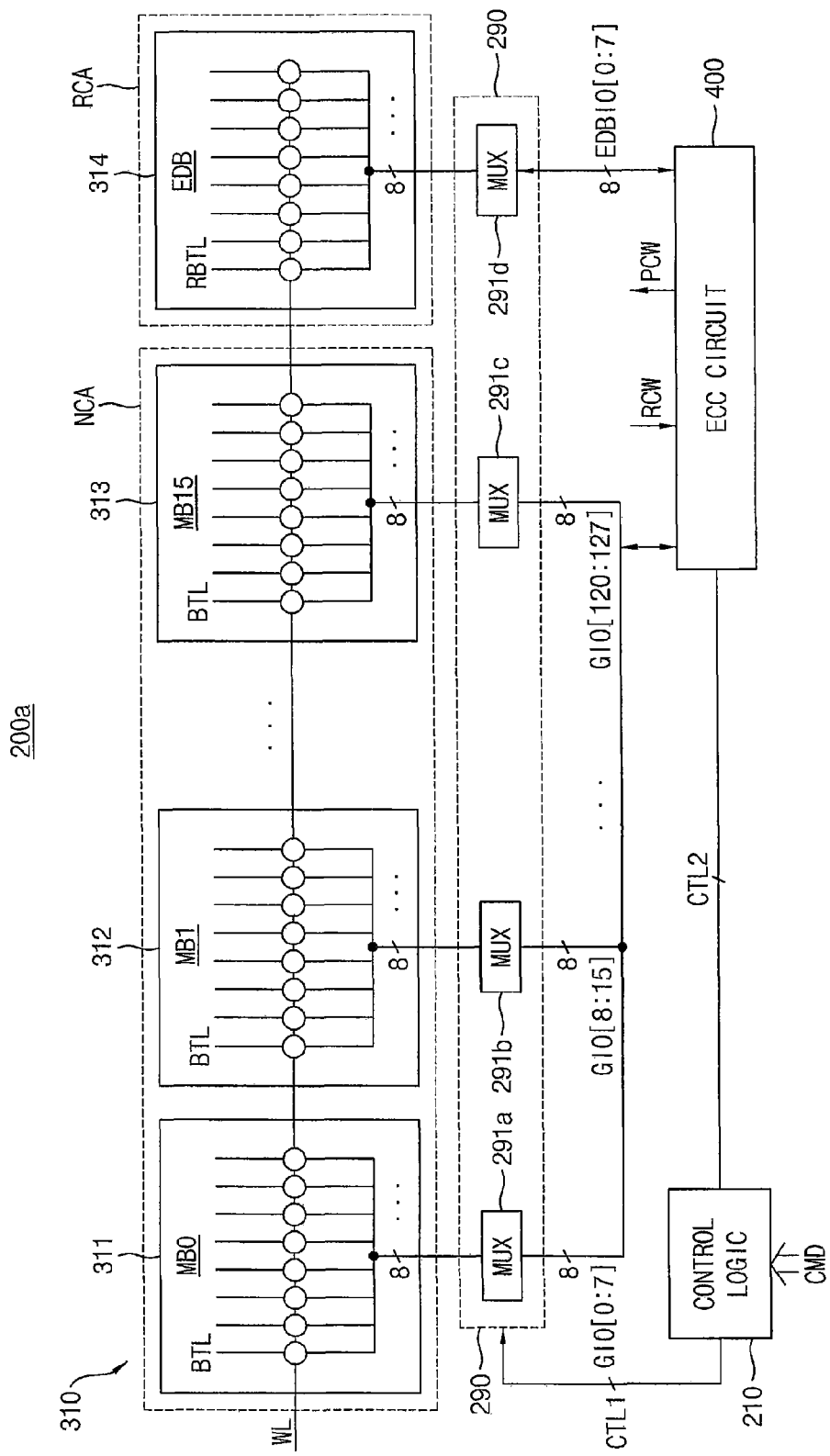
FIG. 7 illustrates a portion of the semiconductor memory device of FIG. 3 in a scrubbing mode.

FIG. 7 illustrates a portion of the semiconductor memory device of FIG. 3 in a scrubbing mode.

In FIG. 7, the control logic circuit 210, the first bank array 310, the I/O gating circuit 290, and the error correction circuit 400 are illustrated.

Referring to FIG. 7, the first bank array 310 may include a normal cell array NCA and a redundancy cell array RCA. The normal cell array NCA may include a plurality of first memory blocks MB0~MB15, i.e., 311~313, and the redundancy cell array RCA may include at least a second memory block 314. The first memory blocks 311~313 determine the memory capacity of the semiconductor memory device 200a. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block.

In each of the first memory blocks 311~313, a plurality of first memory cells are arrayed in rows and columns. In the second memory block 314, a plurality of second memory cells are arrayed in rows and columns.

In the first memory blocks 311~313, rows may be formed, for example, of 8K word-lines WL and columns may be formed, for example, of 1K bit-lines BTL. The first memory cells connected to intersections of the word-lines WL and the bit-lines BTL may be dynamic memory cells or resistive type memory cells. In the second memory block 314, rows may be formed, for example, of 8K word-lines WL and columns may be formed, for example, of 1K bit-lines BTL. The second memory cells connected to intersections of the word-lines WL and the bit-lines RBTL may be dynamic memory cells or resistive type memory cells.

The I/O gating circuit 290 includes a plurality of switching circuits 291a~291d respectively connected to the first memory blocks 311~313 and the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 may be connected to the switching circuits 291a~291d through first data lines GIO[0:127] and second data lines EDBIO[0:7].

The control logic circuit 210 may decode the command CMD to generate the first control signal CTL1 for controlling the switching circuits 291a~291d and the second control signal CTL2 for controlling the error correction circuit 400.

When the command CMD is a scrubbing command, the control logic circuit 210 provides the first control signal CTL1 to the I/O gating circuit 290 such the first unit of read codeword RCW stored in a sub-page of a page in the first bank array 310 is provided to the error correction circuit 400.

The error correction circuit 400, in response to the second control signal CTL2, may perform the scrubbing operation on the first unit of read codeword RCW including a first sub unit of data, a second sub unit of data and a parity data. The error correction circuit 400 performs the scrubbing operation by correcting an error bit (if detected) of the second sub unit of data using the parity data and writing back the corrected second sub unit of data, i.e., a partial codeword PCW in a memory location corresponding to the second sub unit of data of the sub-page in the first bank array 310. When the corrected second sub unit of data is written back in the memory location, power consumption may be greatly reduced when compared with a case in which all data corresponding to the sub-page is written back in a memory location corresponding to the sub-page. In other words, in some embodiments, the first sub unit of data is not written back to memory so that only the second sub unit is written.

The I/O gating circuit 290 and the error correction circuit 400 may perform the scrubbing operation sequentially on a plurality of sub-pages in one page of memory cells in the first bank array 310 under control of the control logic circuit 310.

Figure 8:
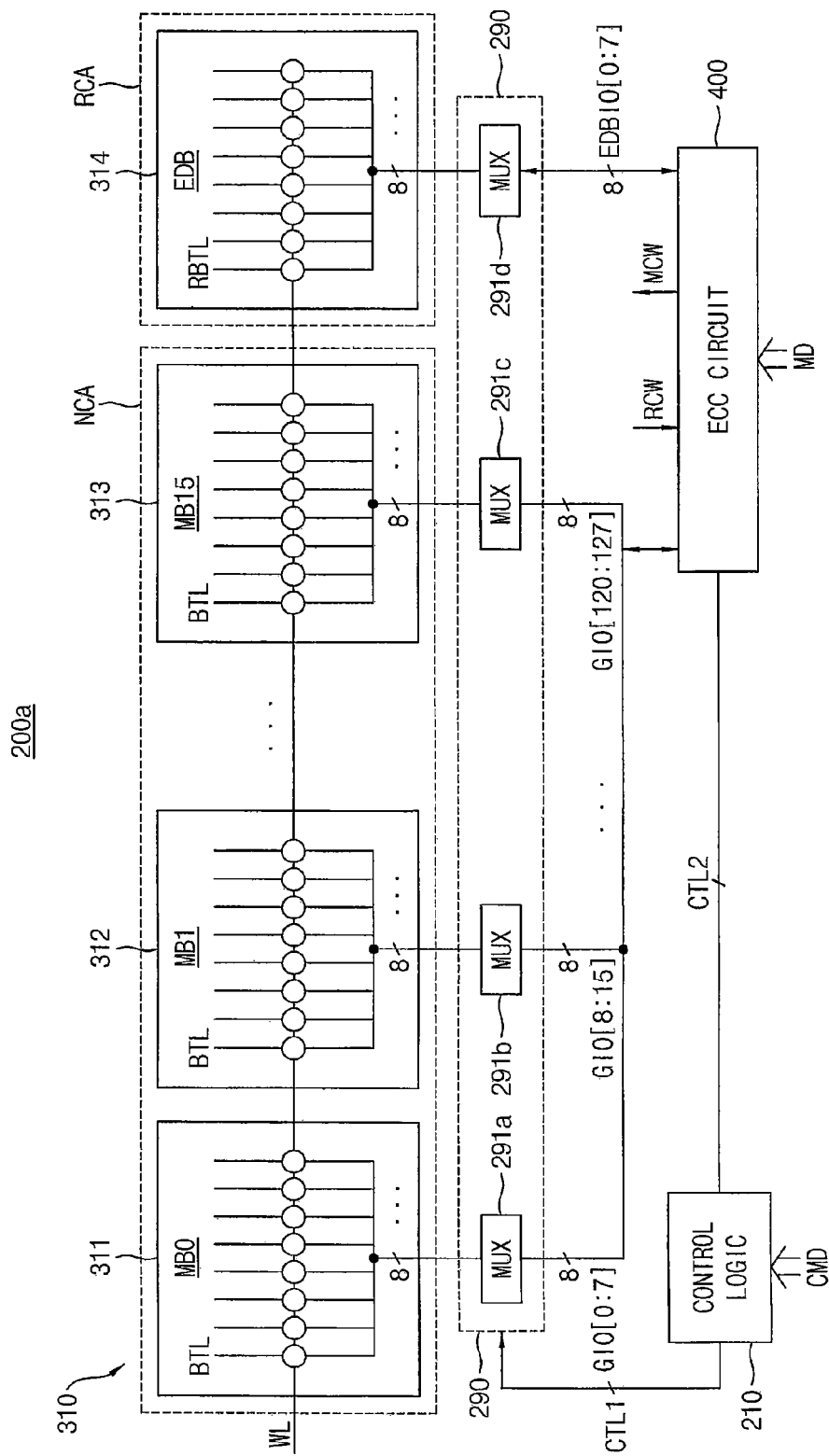
FIG. 8 illustrates a portion of the semiconductor memory device of FIG. 3 in a write operation mode.

FIG. 8 illustrates a portion of the semiconductor memory device of FIG. 3 in a write operation mode.

Referring to FIG. 8, when the command CMD is a write command, the control logic circuit 210 provides the first control signal CTL1 to the I/O gating circuit 290 such the first unit of read codeword RCW stored in a sub-page of a page in the first bank array 310 is provided to the error correction circuit 400. The first unit of read codeword RCW may include a first sub unit of data, a second sub unit of data and a parity data.

The error correction circuit 400, in response to the second control signal CTL2, may correct an error bit of the second sub unit of data using the parity data, may generate a write parity data based on the corrected second sub unit of data and a write main data MD and may provide a modified codeword MCW including the corrected data of the second unit, the write main data MD and the write parity data. The I/O gating circuit 290 may write the modified codeword MCW in a memory location corresponding to a sub-page of a target page in the first bank array 310. When the I/O gating circuit 290 writes the modified codeword MCW in the memory location corresponding to a sub-page of the target page in the first bank array 310, the I/O gating circuit 290 may reduce power consumption by writing the at least one of the corrected second sub unit of data and the write main data MD and the write parity data in the sub-page of the target page. When a memory location corresponding to the second sub unit of data is the same as a memory location in which the write main data MD is to be stored, the I/O gating circuit 290 writes the write main data MD and the parity data in a corresponding memory location. When a memory location corresponding to the second sub unit of data is not the same as a memory location in which the write main data MD is to be stored, the I/O gating circuit 290 writes the write main data MD, the corrected second sub unit of data and the parity data in a corresponding memory location.

Figure 9:
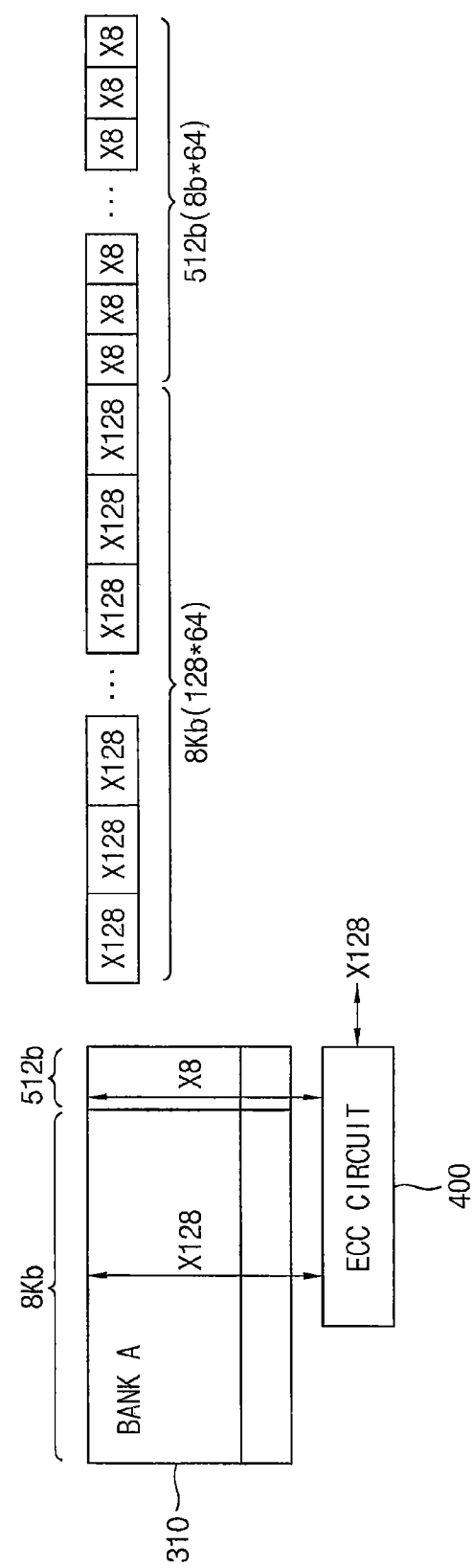
FIG. 9 illustrates a bank array and the error correction circuit shown in the semiconductor memory device of FIG. 3.

FIG. 9 illustrates a bank array and the error correction circuit shown in the semiconductor memory device of FIG. 3.

In FIG. 9, the first bank array 310 is illustrated for convenience, however, the details discussed herein related to the first bank array 310 may equally apply to the other bank arrays 320, 330 and 340.

Referring to FIG. 9, each page of the first bank array 310 has a size of 8 Kb and with each sub-page of the page has a size of 128 b. A parity data of 8 b is stored for each sub-page. Data from each sub-page of 128 b and corresponding parity data of 8 b are sequentially read and provided to the error correction circuit 400. A Hamming code may be used by the error correction circuit 400 for error detection and correction. The ECC method and a codeword length used during read/write operations may also be used for the scrubbing operation according to example embodiments.

The control logic circuit 210 may control a scrubbing operation in response to an external command. For example, the scrubbing operation may be performed in response to a newly defined external command or in response to a known command. Each command is defined by a respective signal combination (for example, the settings of a combination of signals /CS, /RAS, /CAS, and /WE). For example, a respective signal combination may be newly defined for the scrubbing operation (i.e., a specialized scrubbing command) with signals /CS, /RAS, /CAS, and /WE each being set to one of logic high and low levels as may be detected by the memory controller 100 and the semiconductor memory device 200a. In this case, the signal combination for the scrubbing operation may be defined differently from a signal combination for a read command designating a read operation of the memory cell array 300. Alternatively, the scrubbing operation may be performed in response to a known predefined refresh command such as an auto refresh command or a self refresh command.

In response to a scrubbing command, a page is activated. In addition for scrubbing some or all sub-pages of the page, data from each of the sub-pages and corresponding parity data are read and provided to the error correction circuit 400. The error correction circuit 400 performs error detection and correction on such data pieces. Error-corrected sub unit of data is selectively written back to a corresponding memory location on the sub-page.

Operations involved with the scrubbing operation may be variously implemented. For example, a page (i.e., a first page) of the first bank array 310 is activated in response to the scrubbing command. At least one sub-page in the activated page may be sequentially selected. The scrubbing operation (with error detection/correction and data write back) is performed on the selected sub-page. Thereafter, the activated page is deactivated. When another scrubbing command is received, a next page (for example, a second page) of the first bank array 310 is activated.

The number of sub-pages to be scrubbed in response to the newly defined scrubbing command (i.e., a specialized scrubbing command) may be set differently from the number of sub-pages to be scrubbed in response to a pre-defined command. The receiving cycle of the newly defined scrubbing command may be newly decided between the memory controller 100 and the semiconductor memory device 200a. The scrubbing command may be provided to the semiconductor memory device 200a so that all of the pages of the first bank array 310 are activated at least once each refresh cycle (for example, 64 ms) as defined in a specification of the semiconductor memory device 200a. The period of the refresh with scrubbing commands may be set to be long enough to satisfy the refresh cycle as defined in the specification of the semiconductor memory device 200a. The longer the period of the scrubbing command, the greater number of sub-pages that can be selected for scrubbing in response to a single scrubbing command.

On the other hand when a predefined command such as an auto refresh command is used, the period of the auto refresh command is defined according to the specification of the semiconductor memory device 200a. In that case, a number of sub-pages capable of being scrubbed within the receiving cycle may be selected but limited to the time period defined according to the specification of the semiconductor memory device 200a. For example, when the newly defined scrubbing command is used, a scrubbing operation may be performed on all of the sub-pages included in a single page in response to a single scrubbing command. On the other hand, when the auto refresh command is used, a scrubbing operation may be performed on a single sub-page in response to a single refresh command.

Figure 10:
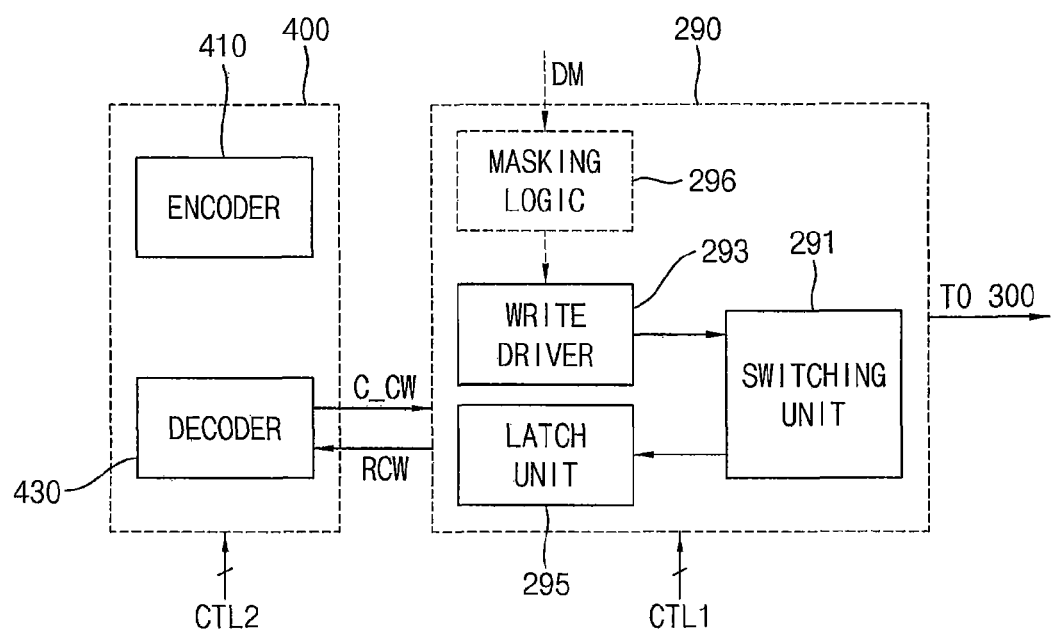
FIG. 10 illustrates the error correction circuit and the I/O gating circuit in the semiconductor memory device of FIG. 3 in a scrubbing mode.

FIG. 10 illustrates the error correction circuit and the I/O gating circuit in the semiconductor memory device of FIG. 3 in a scrubbing mode.

Referring to FIG. 10, the error correction circuit 400 includes an ECC encoder 410 and an ECC decoder 430. The I/O gating circuit 290 includes a switching unit 291, a write driver 293 and a latch unit 295. The I/O gating circuit 290 may further include a masking logic 296. The switching unit 291 may include the switches 291a~291d in FIGS. 7 and 8. The I/O gating circuit 290 may provide the ECC decoder 430 with the read codeword RCW read from a sub-page of a page in the memory cell array 300 in the scrubbing mode. The ECC decoder 430 may correct an error bit in the read codeword RCW using a parity data in the read codeword RCW and may provide a corrected codeword C_CW to the I/O gating circuit 290. The I/O gating circuit 290 receives the corrected codeword C_CW from the ECC decoder 430 and writes back the corrected data of a sub codeword in a memory location corresponding to the sub codeword in the sub-page.

The ECC decoder 430 may perform the above-described scrubbing operation in response to the second control signal CTL2 in the scrubbing mode.

Figure 11:
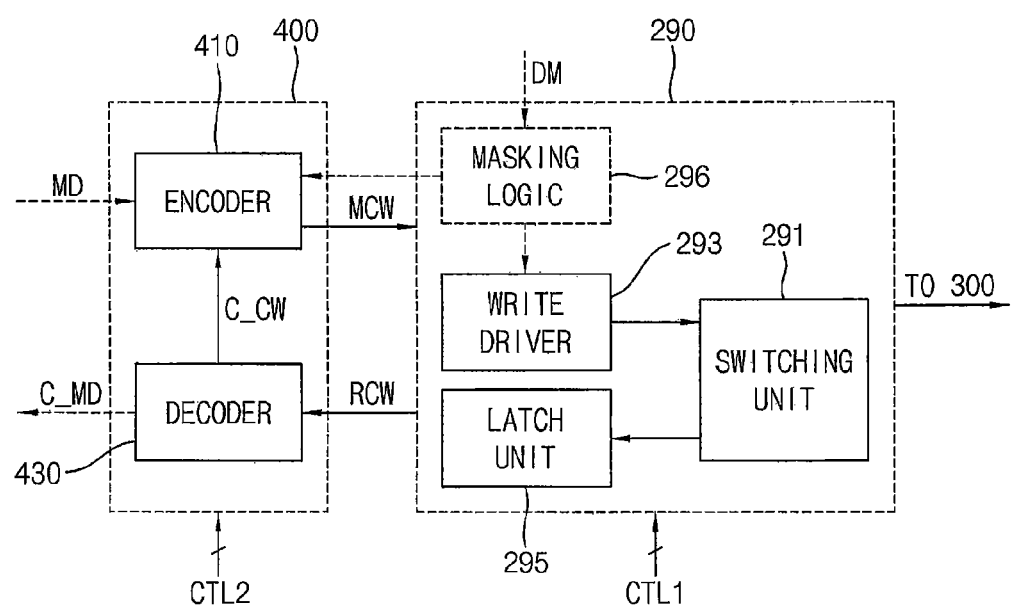
FIG. 11 illustrates the error correction circuit and the I/O gating circuit in the semiconductor memory device of FIG. 3 during in a write operation and a read operation.

FIG. 11 illustrates the error correction circuit and the I/O gating circuit in the semiconductor memory device of FIG. 3 in a write operation and a read operation.

Referring to FIG. 11, in a read operation, the I/O gating circuit 290 may provide the ECC decoder 430 with the read codeword RCW read from a sub-page of a page in the memory cell array 300. The ECC decoder 430 may correct an error bit in the read codeword RCW using a parity data in the read codeword RCW and may provide a corrected main data C_MD to the data I/O buffer 299.

In a write operation, the I/O gating circuit 290 may provide the ECC decoder 430 with the read codeword RCW read from the sub-page of the page in the memory cell array 300. The ECC decoder 430 may correct an error bit in the read codeword RCW using a parity data in the read codeword RCW and may provide a corrected codeword C_CW to the ECC encoder 410. The ECC encoder 410 may generate a write parity data based on the corrected codeword C_CW and the write main data MD and may provide the modified codeword MCW to the I/O gating circuit 290. The modified codeword MCW may include the write main data MD, the corrected data of the sub unit and the write parity data or the write main data MD and the write parity data. The write driver 293 may write the modified codeword MCW in a memory location corresponding to the sub-page of the target page.

The masking logic 296 controls the write driver 293 and the ECC encoder 410 to perform a masked write operation in response to the data mask signal DM from the memory controller 100 in a masked write operation, which can prevent specific sub units of the main data MD from being written to the memory cell array 300.

Figure 12:
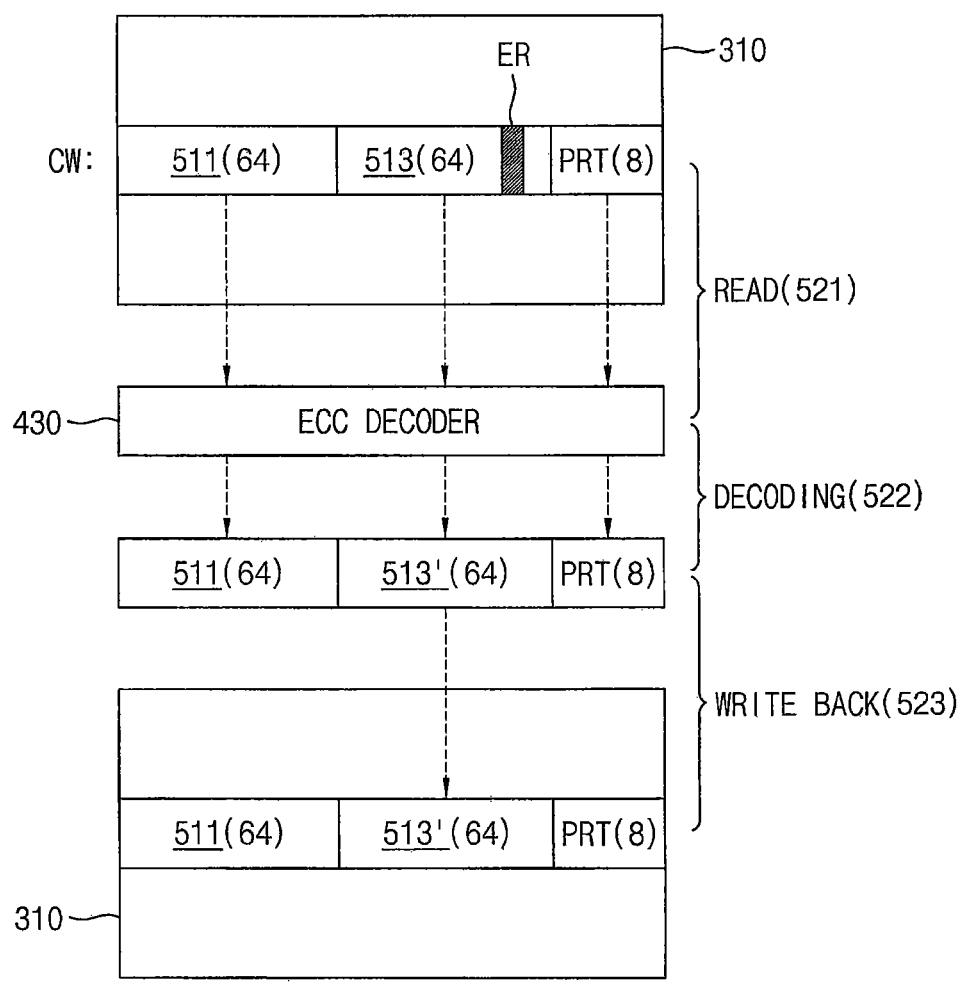
FIG. 12 illustrates a scrubbing operation performed in the semiconductor memory device of FIG. 7.

FIG. 12 illustrates that a scrubbing operation is performed in the semiconductor memory device of FIG. 7.

Referring to FIGS. 7, 9, 10 and 12, when the command CMD is a scrubbing command, the first unit of codeword CW including a 64-bit first sub unit of data 511, a 64-bit second sub unit of data 513 and a 8-bit parity data PRT is read from a sub-page of a page in the first bank array 310 and the first unit of codeword CW is provided to the ECC decoder 430 as a reference numeral 521. The second sub unit of data 513 may include an error bit ER. The ECC decoder 430 performs an ECC decoding on the first unit of codeword CW, corrects the error bit ER in the second sub unit of data 513 and provides the corrected second sub unit of data 513' to the I/O gating circuit 290 as a reference numeral 522. The I/O gating circuit 290 may write back the corrected second sub unit of data 513' in a memory location corresponding to the second sub unit 513 of the sub-page as a reference numeral indicates 523, but may mask (block) the writing of the first sub unit 511 back to memory to provide selective write back of portions of a codeword based on error detection.

Figure 13:
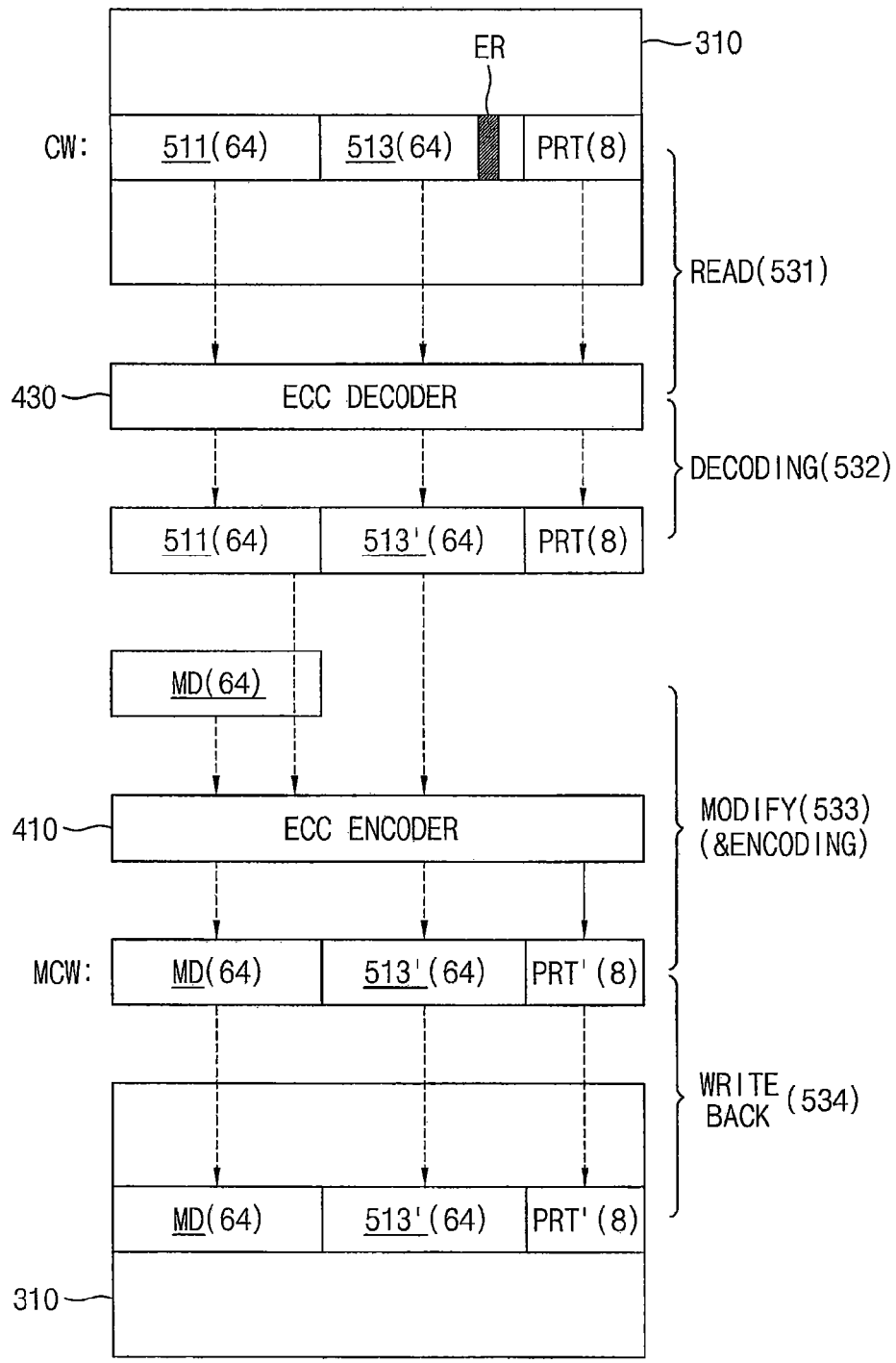
FIG. 13 illustrates a write operation performed in the semiconductor memory device of FIG. 8.

FIG. 13 illustrates that a write operation is performed in the semiconductor memory device of FIG. 8.

Referring to FIGS. 8, 9, 11 and 13, when the command CMD is a write command, the first unit of codeword CW including a 64-bit first sub unit of data 511, a 64-bit second sub unit of data 513 and a 8-bit parity data PRT is read from the sub-page of a page in the first bank array 310 and the first unit of codeword CW is provided to the ECC decoder 430 as a reference numeral indicates 531. The second sub unit of data 513 may include an error bit ER. The ECC decoder 430 performs an ECC decoding on the first unit of codeword CW, corrects the error bit ER in the second sub unit of data 513 and provides the corrected second sub unit of data 513' to the ECC encoder 410 as a reference numeral indicates 532. The ECC encoder 410 also receives the 64-bit write main data MD, performs an ECC encoding based on the write main data MD, generates a 8-bit write parity data PRT' and provides the I/O gating circuit 290 with a modified codeword MCW including the write main data MD 511, the corrected second sub unit of data 513' and the write parity data PRT' as a reference numeral indicates 533. The I/O gating circuit 290 may write the write main data MD, the corrected second sub unit of data 513' and the write parity data PRT' in a memory location corresponding to the sub-page as a reference numeral indicates 534.

Figure 14:
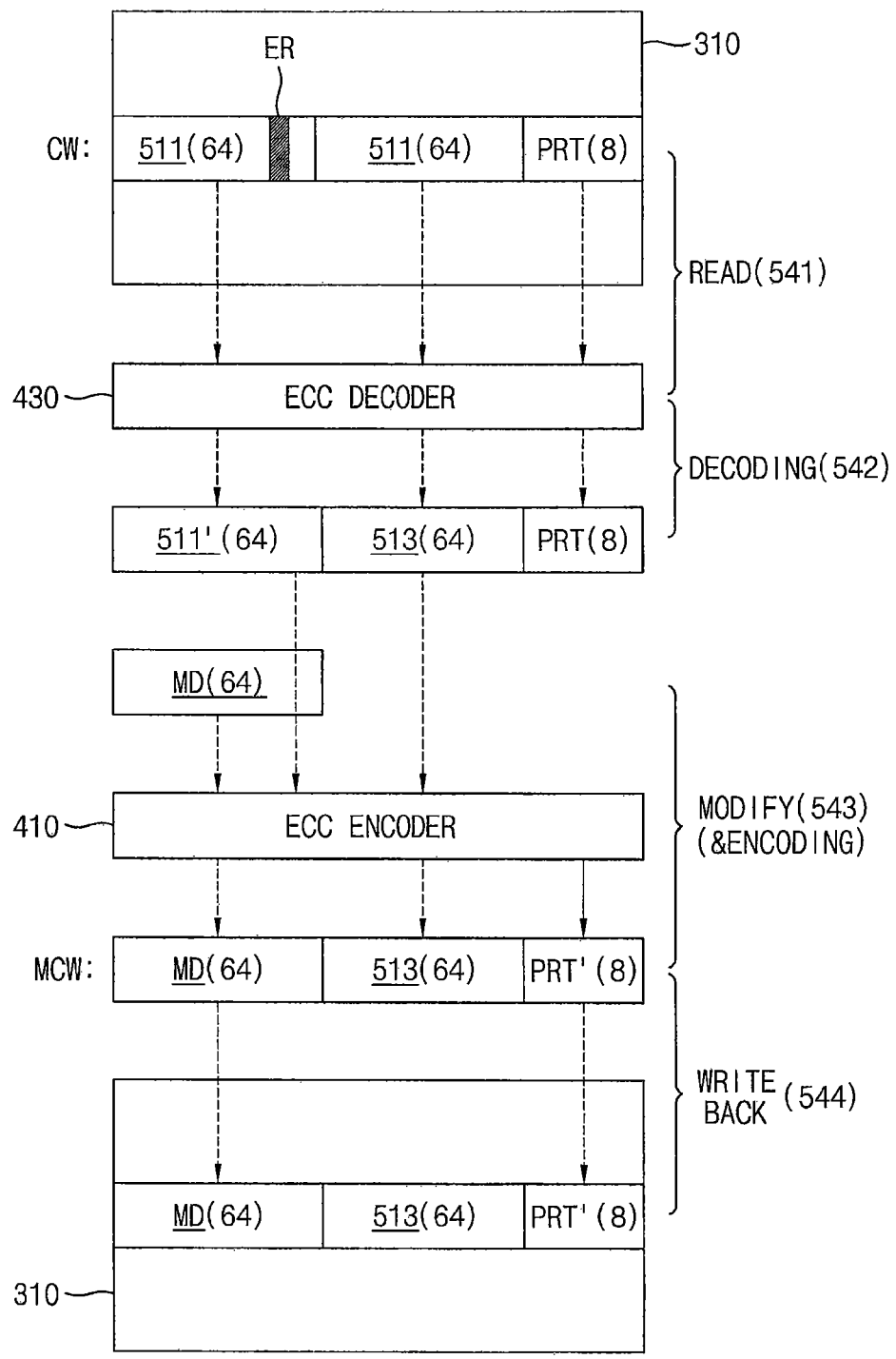
FIG. 14 illustrates a write operation performed in the semiconductor memory device of FIG. 8.

FIG. 14 illustrates that a write operation is performed in the semiconductor memory device of FIG. 8.

Referring to FIGS. 8, 9, 11 and 14, when the command CMD is a write command, the first unit of codeword CW including a 64-bit first sub unit of data 511, a 64-bit second sub unit of data 513 and a 8-bit parity data PRT is read from the sub-page of a page in the first bank array 310 and the first unit of codeword CW is provided to the ECC decoder 430 as a reference numeral 541. The first sub unit of data 511 may include an error bit ER. The ECC decoder 430 performs an ECC decoding on the first unit of codeword CW, corrects the error bit ER in the first sub unit of data 511 and provides the corrected first sub unit of data 511' and the second sub unit of data 513 to the ECC encoder 410 as a reference numeral 542. The ECC encoder 410 also receives the 64-bit write main data MD. Since a memory location of the corrected first sub unit of data 511' is the same as a memory location in which the write main data MD is to be stored, the ECC encoder 410 generates a 8-bit write parity data PRT' based on the write main data and the second unit of data 513 and provides the I/O gating circuit 290 with a modified codeword MCW including the write main data MD, the second unit of data 64 and the write parity data PRT' as a reference numeral 543. The I/O gating circuit 290 writes the write main data MD and the write parity data PRT' in a memory location corresponding to the sub-page of the target page as a reference numeral 544. In this case, the second sub unit of data 513 (which does not include an error bit) is not written to a corresponding memory location which may reduce power consumption during the write operation by eliminating unnecessary write-backs of some portions of a codeword.

Figure 15:
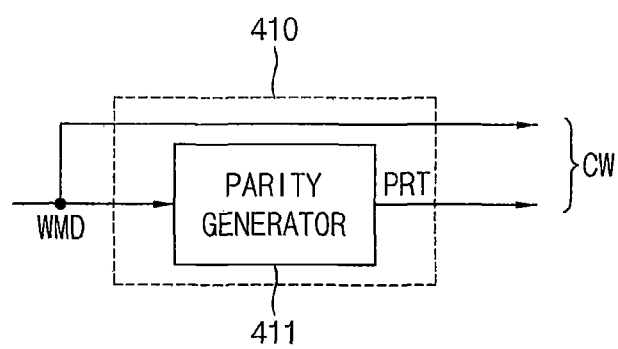
FIG. 15 illustrates the ECC encoder in the error correction circuit in FIG. 10.

FIG. 15 illustrates the ECC encoder in the error correction circuit in FIG. 10.

Referring to FIG. 15, the ECC encoder 410 may include a parity generator 411. The parity generator 411 performs an ECC encoding on the write data WMD to generate the parity data PRT in a write operation and provides the I/O gating circuit 290 with the codeword CW including the write data WMD and the parity data PRT.

Figure 16:
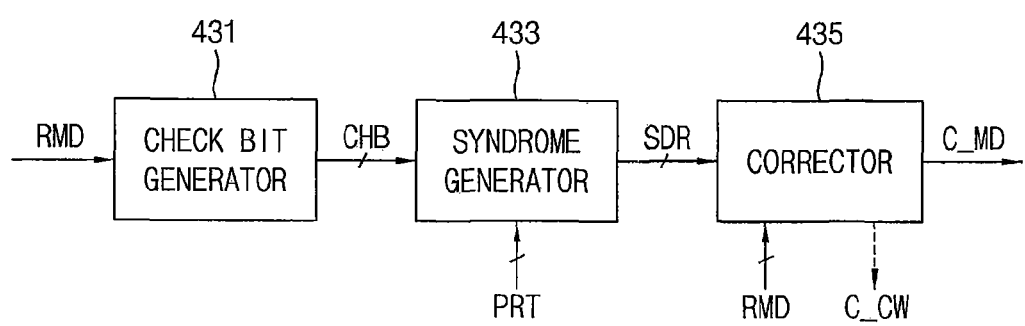
FIG. 16 illustrates the ECC decoder in the error correction circuit in FIG. 10.

FIG. 16 illustrates the ECC decoder in the error correction circuit in FIG. 10.

Referring to FIG. 16, the ECC decoder 430 may include a check bit generator 431, a syndrome generator 433 and a data corrector 435.

The check bit generator 431 may generate check bits CHB based on the read data RMD. The syndrome generator 433 may generate a syndrome data SDR based on a comparison of the check bits CHB based on the read data RMD to the parity data PRT included in the read codeword. The syndrome data SDR may indicate whether the read data RMD includes at least one error bit and may also indicate a position of the error bit. The data corrector 435 may correct the error bit in the read data RMD based on the syndrome data SDR, may provide the corrected codeword C_CW to the I/O gating circuit 290 in a scrubbing mode and may provide the corrected main data C_MD to the data I/O buffer 299 in a read operation.

Figure 17:
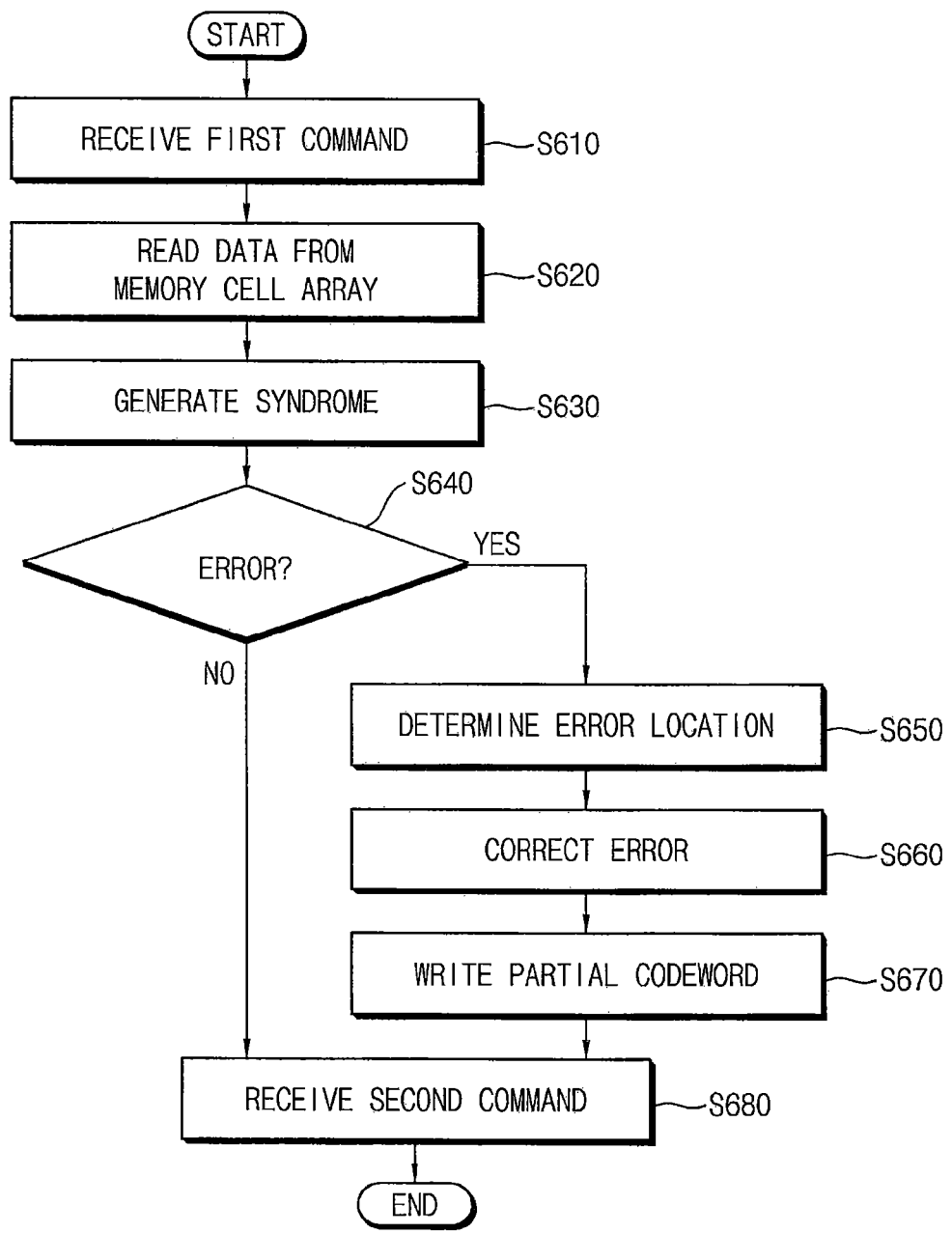
FIG. 17 is a flowchart illustrating a method of operating a semiconductor memory device according to example embodiments.

FIG. 17 is a flowchart illustrating a method of operating a semiconductor memory device according to example embodiments.

Referring to FIGS. 2, 3, 7, 9, 10, 12 and 15 through 17, in a method of operating a semiconductor memory device 200a that includes a memory cell array 300 and an error correction circuit 400, the semiconductor memory device 200a receives a first command from a memory controller 100 (S610).

The command decoder 211 decodes the first command. When the first command is a scrubbing command, at least one sub-page is selected of a page of memory cells in the bank array 310 of the memory cell array 300 and a first unit of data CW including at least two sub units 511 and 513 and the parity data are read from the selected sub-page in response to the first command (S620).

The ECC decoder 430 in the error correction circuit 400 generates the syndrome data SDR (S630) and determines whether the first unit of data CW has at least one error bit (S640). That is, the syndrome generator 433 generates the syndrome data SDR by determining whether corresponding bits of the check bits CHB and the parity data are same with respect to each other. The first unit of data CW has an error bit when at least one bit of the syndrome data SDR is not '0'.

When the first unit of data CW has an error bit (YES in S640), the ECC decoder 430 determines a position of the error bit based on the syndrome data (S650), and corrects the error bit of the sub unit 513 using the parity data PRT of the first unit of data CW (S660). The I/O gating circuit 290 writes back the corrected sub unit of data 513' in a memory location corresponding to the sub unit of data 513 of the sub-page in the bank array 310 (S670).

When the scrubbing operation is completed, or when the first unit of data CW does not have an error bit (NO in S640), the semiconductor memory device 200a receives a second command from the memory controller (S680).

As described above, the control logic circuit 210 may control a scrubbing operation in response to an external command. For example, the scrubbing operation may be performed in response to a newly defined external command or in response to a known command. Each command is defined by a respective signal combination (for example, the settings of a combination of signals /CS, /RAS, /CAS, and /WE). For example, a respective signal combination may be newly defined for the scrubbing operation (i.e., a specialized scrubbing command) with signals /CS, /RAS, /CAS, and /WE each being set to one of logic high and low levels as may be detected by the memory controller 100 and the semiconductor memory device 200a. In this case, the signal combination for the scrubbing operation may be defined differently from a signal combination for a read command designating a read operation of the memory cell array 300. Alternatively, the scrubbing operation may be performed in response to a known predefined refresh command such as an auto refresh command or a self refresh command.

When a predefined command such as an auto refresh command is used, a page (i.e., a first page) of the first bank array 310 is activated in response to the scrubbing command. At least one sub-page in the activated page may be sequentially selected. The scrubbing operation (with error detection/correction and data write back) is performed on the selected sub-page. Thereafter, the activated page is deactivated. When another scrubbing command is received, a next page (for example, a second page) of the first bank array 310 is activated.

When the newly defined scrubbing command is used, a scrubbing operation may be performed on all of the sub-pages included in a single page in response to a single scrubbing command. On the other hand, when the auto refresh command is used, a scrubbing operation may be performed on a single sub-page in response to a single refresh command.

Figure 18:
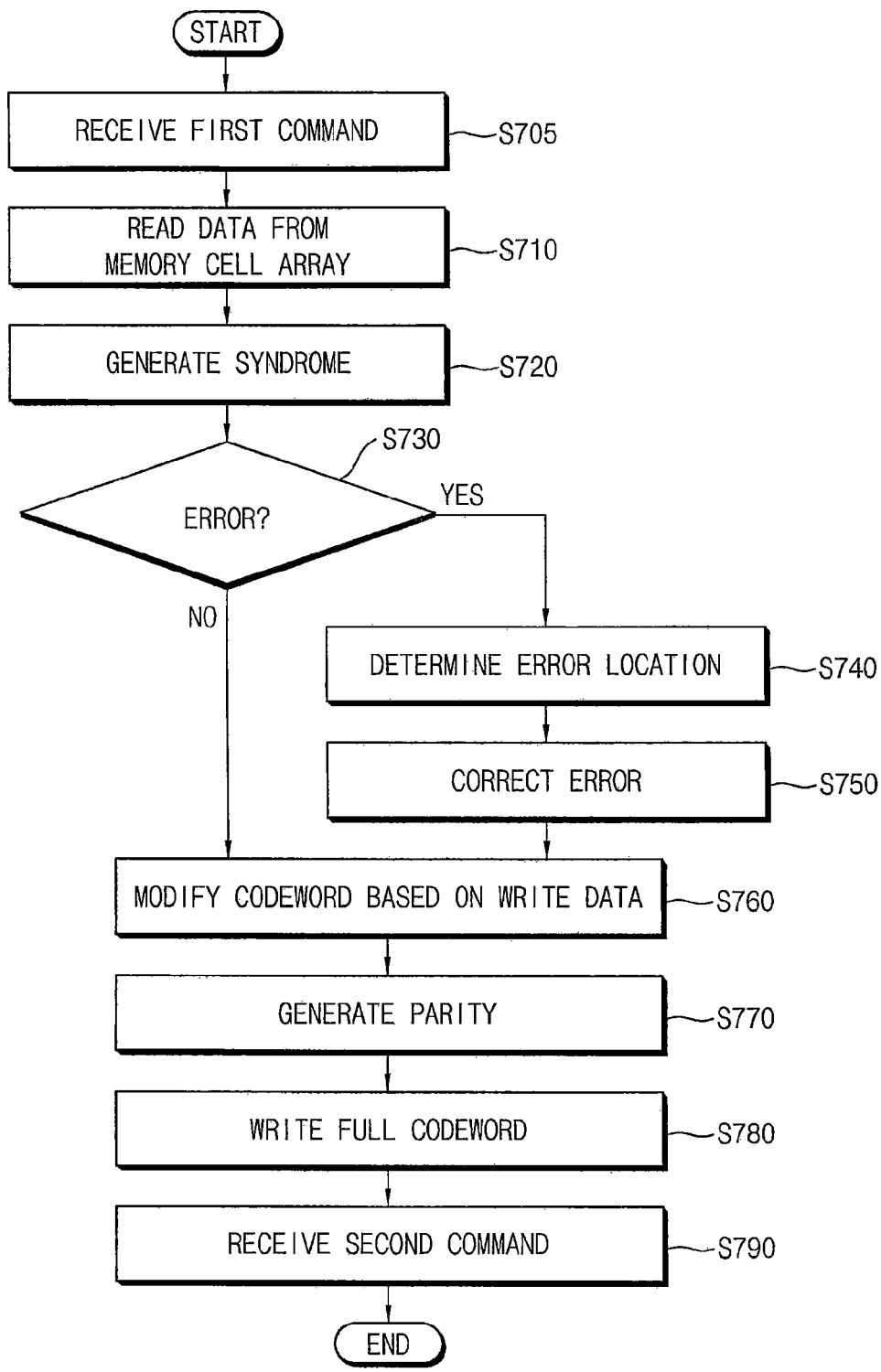
FIG. 18 is a flowchart illustrating a method of operating a semiconductor memory device according to example embodiments.

FIG. 18 is a flowchart illustrating a method of operating a semiconductor memory device according to example embodiments.

Referring to FIGS. 2, 3, 8, 9, 11, 13 through 16 and 18, in a method of operating a semiconductor memory device 200a that includes a memory cell array 300 and an error correction circuit 400, the semiconductor memory device 200a receives a first command from a memory controller 100 (S705).

The command decoder 211 decodes the first command. When the first command is a scrubbing command, at least one sub-page is selected of a page of memory cells in the bank array 310 of the memory cell array 300 and a first unit of data CW including at least two sub units 511 and 513 and the parity data are read from the selected sub-page in response to the first command (S710).

The ECC decoder 430 in the error correction circuit 400 generates the syndrome data SDR (S720) and determines whether the first unit of data CW has at least one error bit (S730). When the first unit of data CW has an error bit (YES in S730), the ECC decoder 430 determines a position of the error bit based on the syndrome data (S740), and corrects the error bit of the sub unit 511 using the parity data PRT of the first unit of data CW (S750). The ECC decoder 430 provides the ECC encoder 410 with the corrected first unit of data (S760).

The ECC encoder 410 modifies the codeword based on the corrected first unit of data and the write data WMD (S760) and generates a write parity data based on the modified codeword (S770). The ECC decoder 410 provides the I/O gating circuit 290 with the modified codeword including at least the write data and the write parity data and the I/O gating circuit 290 writes the modified codeword in a corresponding memory location corresponding of the sub-page in the bank array 310 (S780). That is, the I/O gating circuit 290 may write the write data, the corrected sub unit of data and the write parity data or the write data and the write parity data in the memory location corresponding of the sub-page in the bank array 310.

When the scrubbing operation is completed, or when the first unit of data CW does not have an error bit (NO in S730), the semiconductor memory device 200a receives a second command from the memory controller (S790).

In FIGS. 17 and 18, a size of the first unit of data may correspond to a size of a codeword unit of the semiconductor memory device 200a and each size of the first sub unit of data and second sub unit of data may correspond to a size of data that is pre-fetched in a read operation and a write operation of the semiconductor memory device 200a.

Figure 19:
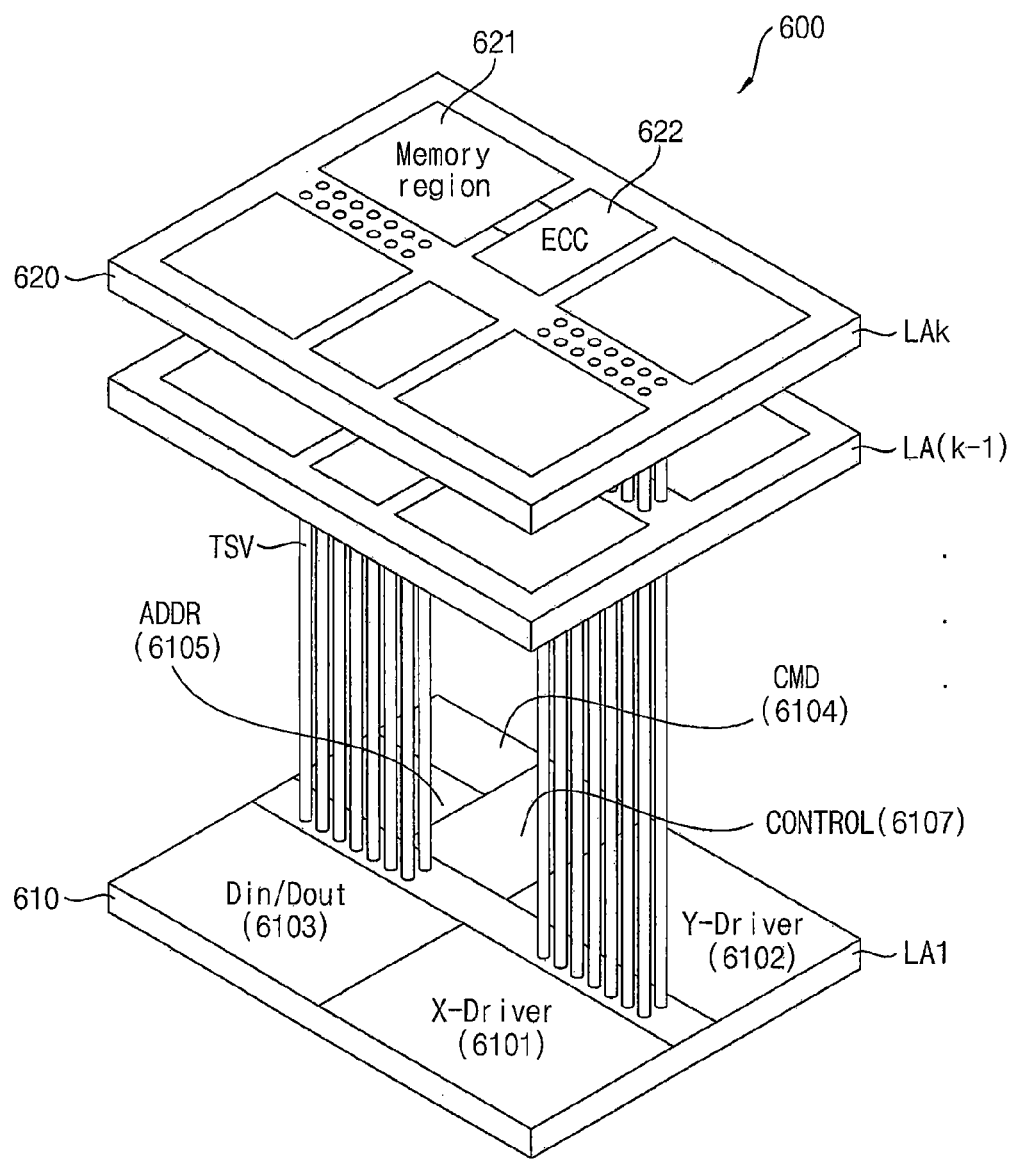
FIG. 19 is a perspective diagram illustrating a semiconductor memory device according to example embodiments.

FIG. 19 is a structural diagram illustrating a semiconductor memory device according to example embodiments.

Referring to FIG. 19, a semiconductor memory device 600 may include first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged as described with reference to FIG. 3.

The first semiconductor integrated circuit layer 610 may further include a control logic (circuit) 6107. The control logic 6107 may access the memory region 621 and may generate control signals for accessing the memory region 621 based on the command from the memory controller.

The kth semiconductor integrated circuit layer 620 may include an error correction circuit 622 that performs an ECC encoding on data to be stored in the memory region 621 and performs an ECC decoding on data read from the memory region 621. The error correction circuit 622, in a scrubbing mode, may perform a scrubbing operation that reads a first unit of data including a first sub-unit of data, a second sub unit of data and a parity data, from a selected sub-page of a plurality of sub-pages in an activated page in the memory region 621, corrects the second sub unit of data including an error bit by using parity data and writes back the corrected second sub unit of data to a memory location that corresponds to the second sub unit in the sub-page but can block writing of portions of the data (the first sub-unit) which does not include an error. Therefore, the semiconductor memory device 200a may reduce power consumption when performing the scrubbing operation.

Figure 20:
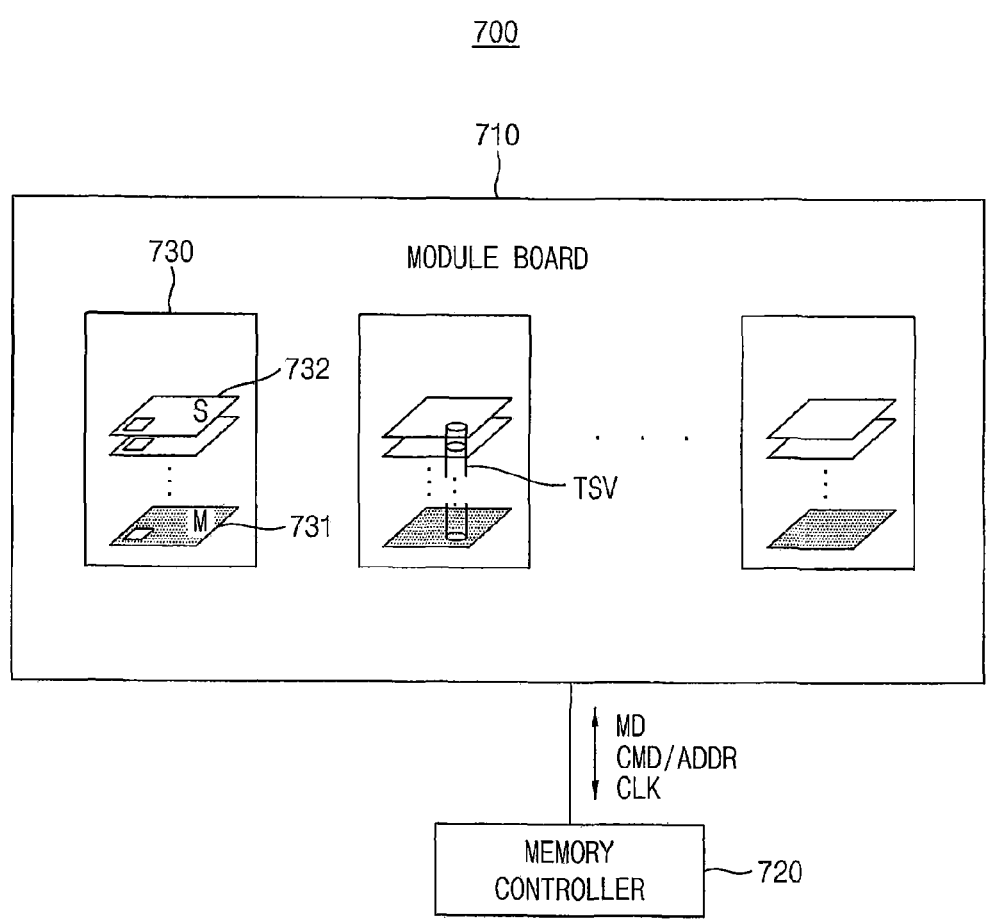
FIG. 20 is a block diagram of a memory system including the semiconductor memory device according to example embodiments.

FIG. 20 illustrates a memory system including the semiconductor memory device according to example embodiments.

Referring to FIG. 20, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include a memory cell array and an error correction circuit as described with reference to FIGS. 2 through 17. The error correction circuit, in a scrubbing mode, may perform a scrubbing operation that reads a first unit of data including a first sub-unit of data, a second sub unit of data and a parity data, from a selected sub-page of a plurality of sub-pages in an activated page in the memory cell array, corrects the second sub unit of data including an error bit by using parity data and writes back the corrected second sub unit of data to a memory location that corresponds to the second sub unit in the sub-page but blocks writing data which is error-free. Therefore, the memory system 700 may reduce power consumption when performing the scrubbing operation.

In addition, in embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus Main data MD, a command/address CMD/ADDR, and a clock signal CLK may be transmitted and received between the memory module 710 and the memory controller 720 via the system bus.

Figure 21:
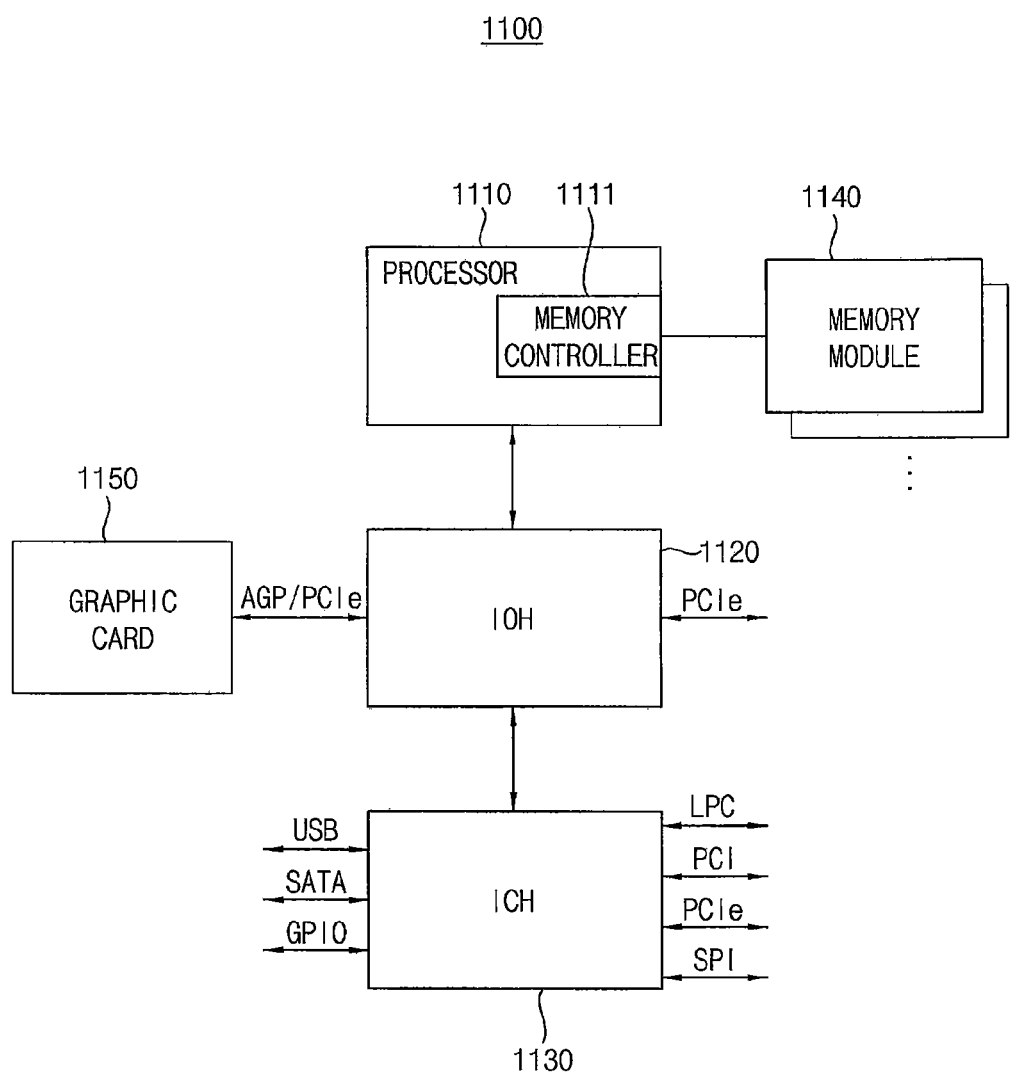
FIG. 21 is a block diagram illustrating a computing system including the semiconductor memory device according to example embodiments.

FIG. 21 is a block diagram illustrating a computing system including the semiconductor memory device according to example embodiments.

Referring to FIG. 21, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a memory cell array and an error correction circuit as described with reference to FIGS. 2 through 17. The error correction circuit may perform the scrubbing operation as describe above and each of the plurality of semiconductor memory devices may reduce power consumption when performing the scrubbing operation.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

The invention claimed is:

1. A method of operating a semiconductor memory device including a memory cell array and an error correction circuit, the method comprising:
   selecting at least one sub-page of a page of memory cells in the memory cell array in response to a first command received from an external memory controller;
   reading a first unit of data including at least two sub units of data and parity data from the sub-page, wherein the at least two sub units of data includes a first sub unit of data and a second sub unit of data, the first sub unit of data is read from a first memory location of the sub-page and the second sub unit of data is read from a second memory location of the sub-page;
   determining, in the error correction circuit, whether the first unit of data includes an error bit;
   when the first unit of data includes an error bit in the second sub unit of data, correcting the error bit using the parity data of the first unit of data in the error correction circuit to provide a corrected second sub unit of data;
   writing back the corrected second sub unit of data to the second memory location of the sub-page, wherein a size of the first unit of data corresponds to a size of a codeword unit of the semiconductor memory device and each size of the first sub unit of data and second sub unit of data corresponds to a size of data that is pre-fetched in a read operation and a write operation of the semiconductor memory device; and
   wherein each size of the first sub unit of data and second sub unit of data is less than the size of the codeword unit.

2. The method of claim 1, further comprising:
   receiving a second command from the external memory controller after writing back the corrected second sub unit of data.

3. The method of claim 1, wherein determining whether the first unit of data includes an error bit is performed by the error correction circuit by generating syndrome data based on the first unit of data.

4. The method of claim 1, wherein the first command corresponds to a scrubbing command encoded using signals different from signals corresponding to a read command designating a read operation of the semiconductor memory device.

5. The method of claim 4, wherein the memory cell array includes a plurality of bank arrays, each of the bank arrays includes a plurality of pages of memory cells, and each of the plurality of pages includes a plurality of sub-pages, and
wherein one of the plurality of pages of the memory cells is activated to provide an activated page in response to the first command to provide an activated bank, and
corrected sub unit data is written back in memory locations corresponding to at least two sub-pages in the activated page.

6. The method of claim 5, wherein the first command is received according to a specified frequency,
wherein the memory cell array includes a plurality of bank arrays, and each of the bank arrays includes a plurality of pages of memory cells, and
wherein the plurality of pages of memory cells are sequentially activated at the specified frequency in response to receiving the first command, and a plurality of sub-pages in the activated page are sequentially selected.

7. The method of claim 1, wherein the first command corresponds to a refresh command designating a refresh operation of the semiconductor memory device.

8. The method of claim 7, wherein the memory cell array includes a plurality of bank arrays, and each of the bank arrays includes a plurality of pages of memory cells, and
wherein one of the plurality of pages of memory cells is activated to provide an activated page in response to the refresh command and a corrected sub unit of data is written back to a memory location corresponding to one sub-page in the activated page.

9. A semiconductor memory device comprising:
a memory cell array including a plurality of bank arrays, each having a plurality of pages of memory cells;
a control logic circuit configured to decode a command from an external memory controller to generate control signals; and
an error correction circuit configured to perform an error correction code (ECC) decoding on read data fetched from the memory cell array,
wherein the control logic circuit is configured to select a sub-page of a page of the plurality of pages of memory cells in response to a first command received from the external memory controller and is configured read a first unit of data including at least two sub units of data and parity data from the sub-page, wherein the at least two sub units of data includes a first sub unit of data and a second sub unit of data, the first sub unit of data is read from a first memory location of the sub-page and the second sub unit of data is read from a second memory location of the sub-page, and is configured to determine whether the first unit of data includes an error bit,
when the first unit of data includes the error bit and the error bit is included in the second sub unit of data, correct the error bit to provide corrected second sub unit of data,
write back the corrected second sub unit of data to the second memory location of the sub-page, wherein a size of the first unit of data corresponds to a size of a codeword unit of the semiconductor memory device and each size of the first sub unit of data and second sub unit of data corresponds to a size of data that is pre-fetched in a read operation and a write operation of the semiconductor memory device; and
wherein each size of the first sub unit of data and second sub unit of data is less than the size of the codeword unit.

10. The semiconductor memory device of claim 9, wherein the memory cell array includes a three-dimensional memory cell array and each of the bank arrays includes a plurality of dynamic memory cells or a plurality of resistive type memory cells.

11. A method of scrubbing errors from a semiconductor memory device including a memory cell array and an error correction circuit, the method comprising:
accessing a page of the memory cell array to provide data that includes sub units that are separately writable to the page of the memory cell array and to provide parity data configured to detect and correct a bit error in the data;
selectively enabling write-back of a selected sub unit of the data responsive to determining that the selected sub unit of the data includes a correctable error upon access as part of an error scrubbing operation, wherein a size of the sub units corresponds to a size of data that is pre-fetched in a read operation and a write operation of the semiconductor memory device; and
wherein the size of the sub units is less than a size of a codeword unit of the semiconductor memory device.

12. The method of claim 11 wherein selectively enabling write-back comprises:
detecting the correctable error in a first sub unit of the data as the selected sub unit;
correcting the correctable error to provide corrected data; and
writing the corrected data back to the page of the memory cell array.

13. The method of claim 12 wherein writing the corrected data back to the page of the memory cell array further comprises:
receiving write data as a second sub unit of the data for combination with the first sub unit of the data to provide modified data; and
generating modified parity data using the modified data; and
writing the modified data and the modified parity data to replace the data.

14. The method of claim 11 wherein selectively enabling write-back comprises:
detecting no error in a first sub unit of the data as the selected sub unit; and
blocking writing the first sub unit back to the page of the memory cell array as part of an error scrubbing operation.

15. The method of claim 14 wherein blocking writing the first sub unit back to the page of the memory cell array further comprises:
receiving write data as a second sub unit of the data for combination with the first sub unit of the data to provide modified data; and
generating modified parity data using the modified data; and writing the second sub unit of the data and the modified parity data.

16. The method of claim 15 further comprising:
blocking writing the first sub unit of the data with the second sub unit of the data and the modified parity data.

17. The method of claim 11 wherein accessing the page of the memory cell array comprises accessing the page of the memory cell array as a background process after a write operation is received from a host.

18. The method of claim 11 wherein accessing the page of the memory cell array comprises accessing the page of the memory cell array as a scrubbing command received from a host.

* * * * *